United States Patent
Cheah et al.

(10) Patent No.: US 6,765,292 B2
(45) Date of Patent: Jul. 20, 2004

(54) CONTACT STRUCTURE FOR SEMICONDUCTOR DEVICE

(75) Inventors: Chuan Cheah, Redondo Beach, CA (US); Bharat Shivkumar, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/316,249

(22) Filed: Dec. 10, 2002

(65) Prior Publication Data

US 2003/0107130 A1 Jun. 12, 2003

Related U.S. Application Data

(60) Provisional application No. 60/338,987, filed on Dec. 10, 2001.

(51) Int. Cl.[7] .......................... H01L 23/48; H01L 23/52; H01L 29/40; H01L 29/76; H01L 29/94
(52) U.S. Cl. .......................... 257/734; 257/341; 257/777
(58) Field of Search ................................ 257/341, 734, 257/777

(56) References Cited

U.S. PATENT DOCUMENTS

| | | | | |
|---|---|---|---|---|
| 3,972,062 A | * | 7/1976 | Hopp ........................ | 257/778 |
| 4,646,129 A | * | 2/1987 | Yerman et al. ............. | 257/704 |
| 6,040,626 A | | 3/2000 | Cheah et al. .............. | 257/735 |
| 6,127,727 A | * | 10/2000 | Eytcheson ................. | 257/692 |
| 6,262,489 B1 | * | 7/2001 | Koors et al. ............... | 257/784 |
| 6,396,127 B1 | | 5/2002 | Munoz et al. ............. | 257/666 |
| 6,521,982 B1 | * | 2/2003 | Crowley et al. ........... | 257/676 |
| 2003/0127729 A1 | * | 7/2003 | Fukumoto et al. ......... | 257/723 |

* cited by examiner

Primary Examiner—Long Pham
Assistant Examiner—Howard Weiss
(74) Attorney, Agent, or Firm—Ostrolenk, Faber, Gerb & Soffen, LLP

(57) ABSTRACT

A power semiconductor package, comprising: a power MOSFET die having a bottom surface with a bottom electrode disposed for contacting a conductor on a support board, and having a top surface with a top electrode; a bump strap which bridges over the power MOSFET die, having mounting portions disposed respectively on opposite sides of the power MOSFET die and disposed for mounting on the support board, and a central portion which engages and is conductively connected to the top electrode of the power MOSFET die. The bottom electrode comprises at least one of a drain electrode and a gate electrode, and the top electrode comprises a source electrode. The bump strap extends upward from the mounting portions to define a respective pair of upper portions of the bump strap which are disposed above the power MOSFET die, the central portion of the bump strap being disposed lower than the upper portions so as to be adjacent to the top electrode of the power MOSFET die.

11 Claims, 2 Drawing Sheets

CONTACT STRUCTURE FOR SEMICONDUCTOR DEVICE

CROSS-REFERENCE TO RELATED APPLICATION

This application is based on and claims priority of U.S. Provisional Application No. 60/338,987 filed on Dec. 10, 2001, the disclosure of which is incorporated by reference herein.

FIELD OF THE INVENTION

This invention relates to semiconductor devices, and more specifically relates to a novel contact structure for such devices.

BACKGROUND OF THE INVENTION

Semiconductor devices used for higher current ratings (power devices which are generally those which handle in excess of one watt of power) have various types of contact structures which help to remove heat from the semiconductor die to areas external of the die or its package.

One structure which is very efficient for that purpose is the "Copper Strap" package of International Rectifier Corporation in which the top electrode, for example, the source electrode of a Power MOSFET, is contacted by a thick copper contact which efficiently extracts heat from the die, and also serves as a source contact for the device. This device is shown in U.S. Pat. No. 6,040,626, the disclosure of which is incorporated by reference herein.

Another International Rectifier Corporation patent, U.S. Pat. No. 6,396,127, discloses a semiconductor package including a semiconductor power MOSFET die having a bottom surface defining a drain connection and a top surface on which a first metalized region defining a source and a second metalized region defining a gate are disposed, the bottom surface being coupled to a first terminal; a copper plate coupled to and spanning a substantial part of the first metalized region defining the source connection, the copper plate including at least one chamfered edge extending upward and away from the first metalized region; and at least one beam portion being sized and shaped to couple the copper plate portion to the at least one second terminal such that it is electrically coupled to the source.

Another device, known as a "Direct FET" device, also made by International Rectifier Corporation, employs a flip chip type die, for example, a MOSFET with source and gate balls on one surface of the die. The back surface of the die (the drain electrode) receives a cup-shaped metal drain contact which has a flange telescoped over the edge of the die, which flange terminates in the plane of the source and gate balls. Thus, the device is easily surface mounted on a printed circuit board or the like. Such a device is shown in copending application Ser. No. 09/819,774, filed Mar. 28, 2001 entitled CHIP SCALE SURFACE MOUNTED DEVICE AND PROCESS OF MANUFACTURE in the names of Martin Standing and Hazel Deborah Schofield, pending; the disclosure of which is incorporated by reference herein.

It would be desirable to retain or improve the thermal characteristics of existing devices while also simplifying the manufacture process.

BRIEF DESCRIPTION OF THE INVENTION

The present invention relates to a novel bump strap package which has a flip-chip die with bottom source and gate bumps (for a MOSFET for example) and having a top U-shaped stress-relieving copper drain contact strap with connection ear portions at its opposite ends. A second semiconductor die (for example, an IC for the first die) can be mounted on the top surface of the drain strap.

BRIEF DESCRIPTION OF THE INVENTION

Figure 1:
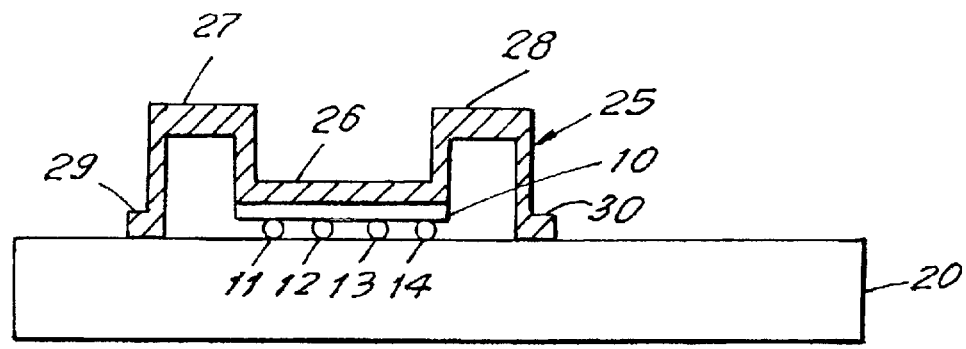
FIG. 1 is a cross-section of a first embodiment of the invention.

FIG. 1 shows a surface mount semiconductor device package in which a flip chip die 10 has solder balls 11, 12, 13 and 14 on its bottom surface. If die 10 is a power MOSFET, balls 11, 12 and 13 may be source electrode balls and ball 14 a gate ball. However, die 10 can be any type of semiconductor device, such as a diode, IGBT, thyristor or the like, and the balls 11 to 14 (or any desired number of balls) would be appropriately arrayed.

The balls 11 to 14 are arranged for surface mounting to suitable conductive traces (not shown) on support board 20, which may be a printed circuit board.

Figure 4:
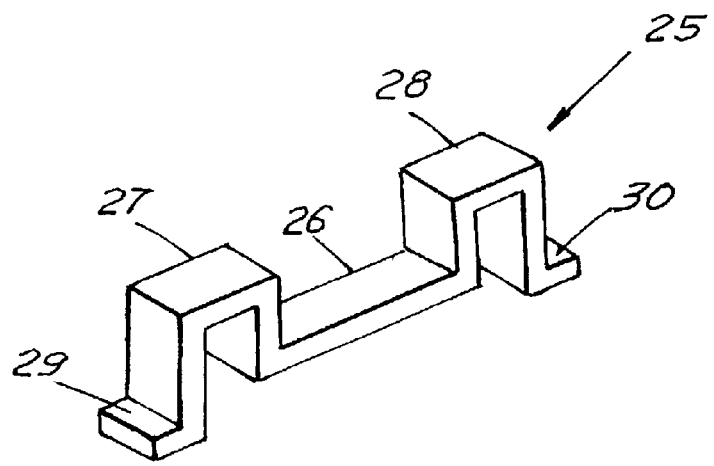
FIG. 4 is a perspective view of the strap used in FIGS. 1 and 2.

A heavy copper bump strap 25 (FIGS. 1, 2 and 4) has a reentrant section 26, upper sections 27 and 28 and mounting flanges 29 and 30. The bottom surface of reentrant section 26 presses upon, and is conductively connected to the top surface (drain electrode) of die 10 as by solder or conductive adhesive such as a silver loaded epoxy. The bottom surfaces of flanges 29 and 30 lie substantially in a common plane which is coplanar with the bottoms of balls 11 and 14 after they are reflowed for connection to traces on board 20. Note that the bottoms of flanges 29 and 30 will also align to corresponding drain traces on board 20. Note further that the use of balls 11 to 14, instead of planar contacts provides stress relief and helps to prevent die cracking. The reentrant sections also cooperate in this stress relief function. Further, the package of FIG. 1 has excellent power handling capability and simplified manufacture.

Figure 2:
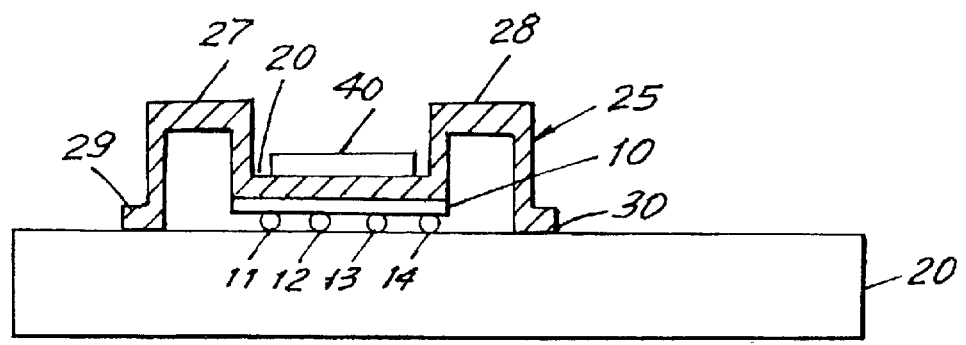
FIG. 2 is a cross-section of a second embodiment of the invention.

FIG. 2 is the structure of FIG. 1, but shows an additional semiconductor die 40 fixed atop the upper surface of reentrant section 26. Die 40 may be a second MOSFET with a bottom drain electrode connected to the drain of die 10 (if a MOSFET), or can be a control IC for die 10, or the like.

Figure 3:
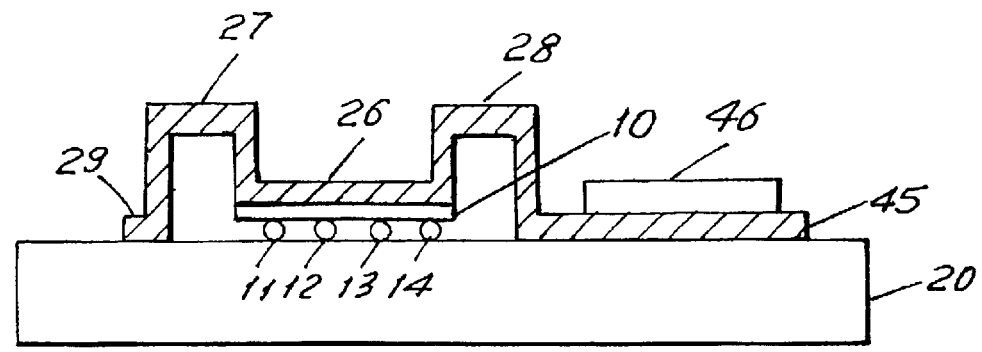
FIG. 3 is a cross-section of a third embodiment of the invention.

FIG. 3 is a modification of FIG. 1 in which flange 30 of FIG. 1 is extended as elongated flange 45 which receives a die 46 (an IC or MOSFET or the like). A similar modification can be made of FIG. 2 to provide a third die on the extended flange.

Figure 5:
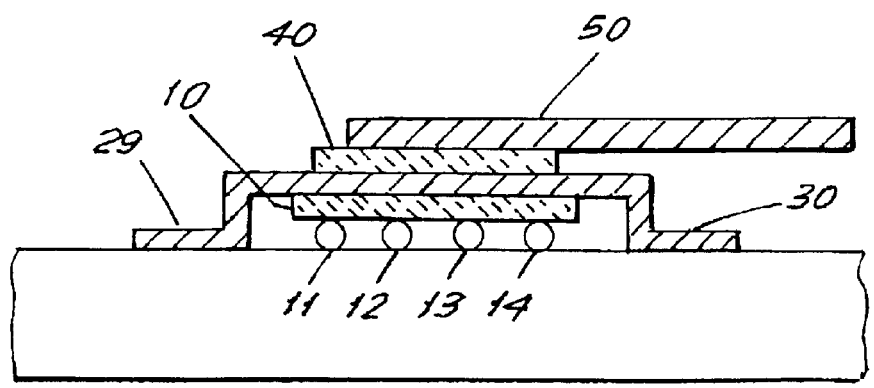
FIG. 5 is a cross-section of a fourth embodiment of the invention.

FIG. 5 shows a further embodiment of the invention in which the reentrant sections 27 and 28 are removed and in which the top of die 40 of FIG. 2 is contacted by a further copper strap 50 which serves as an electrode for the top for die 40.

Although the present invention has been described in relation to particular embodiments thereof, many other variations and modifications and other uses will become apparent to those skilled in the art. Therefore, the present invention is not limited by the specific disclosure herein.

What is claimed is:

1. A semiconductor package comprising:

a semiconductor die having a bottom surface with a bottom electrode thereron and disposed for contacting a conductor on a support board, and having a top surface with a top electrode thereon;

a bump strap which bridges over said semiconductor die, having mounting portions disposed respectively on opposite sides of the semiconductor die for being mounted on said support board, and a central portion which engages and is conductively connected to said top elcetrode of said semiconductor die;

wherein said bump strap extends upward from said mounting portions to define a respective pair of upper portions of said bump strap which are disposed above said semiconductor die, said central portion of said bump strap being disposed lower than said upper portions so as to be adjacent to said top electrode of said semiconductor die;

further comprising a second semiconductor die having at least a bottom electrode, said second semiconductor die being disposed with said bottom electrode thereof conductively connected to and disposed on said bump strap.

2. A semiconductor package of claim 1, wherein said second semiconductor die is disposed on said central portion of said bump strap.

3. A semiconductor package of claim 1, wherein said second semiconductor die is disposed on one of said mounting portions of said bump strap.

4. A semiconductor package of any one of claims 1, 2 and 3, wherein said mounting portions each comprise a flange extending generally along said support board.

5. A semiconductor package of claim 4, further comprising said support board, said support board being a circuit board and said mounting portions being conductively connected to conductors on said circuit board.

6. A semiconductor package comprising:

a semiconductor die having a bottom surface with a bottom electrode thereon and disposed for contacting a conductor on a support board, and having a top surface with a top electrode thereon;

a bump strap which bridges over said semiconductor die, having mounting portions disposed respectively on opposite sides of the semiconductor die for being mounted on said support board, and a central portion which engages and is conductively connected to said top electrode of said semiconductor die;

further comprising a second semiconductor die having at least a bottom electrode, said second semiconductor die being disposed on and with said bottom electrode conductively connected to said bump strap; and wherein said second semiconductor die further comprises a top electrode, and a second strap is connected to said top electrode.

7. A power semiconductor package of any one of claims 2, 3 and 6 wherein said semiconductor die is a power MOSFET die.

8. A semiconductor package of claim 7, further comprising said support board, said support board being a circuit board and said mounting portions being conductively connected to conductors on said circuit board.

9. A semiconductor package of claim 7, wherein said bottom electrode comprises at least one of a drain electrode and a gate electrode, and said top electrode comprises a source electrode.

10. A semiconductor package of claim 7, wherein said bottom electrode comprises at least one solder ball.

11. A semiconductor package of claim 10, wherein said at least one solder ball has a bottom surface which is substantially coplanar with a bottom surface defined by said mounting portions.

\* \* \* \* \*